United States Patent [19]

Mishra et al.

[11] Patent Number: 5,053,348

[45] Date of Patent: Oct. 1, 1991

[54] FABRICATION OF SELF-ALIGNED, T-GATE HEMT

[75] Inventors: Umesh K. Mishra, Cary, N.C.; Mark A. Thompson, Thousand Oaks; Linda M. Jelloian, Northridge, both of Calif.

[73] Assignee: Hughes Aircraft Company, Los Angeles, Calif.

[21] Appl. No.: 444,708

[22] Filed: Dec. 1, 1989

[51] Int. Cl.$^5$ .......................................... H01L 21/285
[52] U.S. Cl. ...................................... 437/41; 437/40; 437/912; 437/43; 437/44; 437/944; 148/DIG. 100; 148/DIG. 102; 148/DIG. 143
[58] Field of Search ................... 437/40, 41, 912, 203, 437/944, 43, 44; 148/DIG. 100, DIG. 88, DIG. 26, DIG. 102, DIG. 104, DIG. 141, DIG. 143

[56] References Cited

U.S. PATENT DOCUMENTS

| | | | |
|---|---|---|---|
| 4,546,540 | 10/1985 | Ueyanagi et al. | 148/DIG. 143 |
| 4,670,090 | 6/1987 | Sheng et al. | 437/944 |
| 4,700,462 | 10/1987 | Beaubien et al. | 437/40 |
| 4,889,831 | 12/1989 | Ishii et al. | 437/31 |
| 4,916,498 | 4/1990 | Berenz | 357/16 |

FOREIGN PATENT DOCUMENTS

| | | | |
|---|---|---|---|
| 0144681 | 6/1989 | Japan | 437/984 |
| 0236658 | 9/1989 | Japan | 437/944 |

OTHER PUBLICATIONS

Wolf et al., "Silicon Processing for the VLSI Era", 1986, pp. 407–409, 421–423.

Primary Examiner—Brian E. Hearn
Assistant Examiner—Tuan Nguyen
Attorney, Agent, or Firm—Paul M. Coble; W. K. Denson-Low

[57] ABSTRACT

A generally T-shaped gate is formed by electron beam irradiation of a multilevel resist structure on a substrate. The resist structure has an upper layer which is more sensitive to the electron beam than a lower layer thereof. A generally T-shaped opening is formed in the resist structure by etching of the irradiated areas. An electrically conductive metal is deposited to fill the opening and thereby form a T-shaped gate on the substrate. After the resist layer structure and metal deposited thereon is removed, a masking layer is formed on the substrate around the gate, having an opening therethrough which is aligned with and wider than the cross section of the gate, and defining first and second lateral spacings between opposite extremities of the cross section and adjacent edges of the opening. Deposition of an electrically conductive metal forms source and drain metallizations on the substrate on areas underlying the first and lateral spacings respectively. The metallizations are self-aligned to the gate and separated therefrom by the masking effect of the gate during the metal deposition. The gate may have an asymmetrical top section which provides a larger spacing between the gate and drain metallization than between the gate and source metallization to increase the breakdown voltage of the device. Insulative oxide sidewalls may be formed on the gate.

14 Claims, 7 Drawing Sheets

FABRICATION OF SELF-ALIGNED, T-GATE HEMT

BACKGROUND OF THE INVENTION

1. Field of the Invention

The present invention generally relates to the fabrication of microelectronic devices, and more specifically to the fabrication of a T-gate field effect transistor such as a high-electron mobility transistor using a self-aligned process.

2. Description of the Related Art

The high-electron mobility transistor (HEMT) is a variant of GaAs field effect transistor (FET) technology that offers substantially better performance than standard metal-semiconductor field-effect transistor (MESFET) devices, particularly at low temperatures. Usually fabricated by molecular beam epitaxy (MBE), in which layers are built up by deposition of molecules in a vacuum, a conventional HEMT uses an undoped GaAs channel with a thin doped layer of AlGaAs between the channel and metal gate. The doped layer furnishes the electrons for the channel.

The principal advantage of the device is that the electron mobility in the channel is higher in the HEMT than in a MESFET, because there are no dopant ions in the channel to scatter carriers. This gives HEMT devices a fast turn-on characteristic. They develop nearly their full transconductance with gate-logic voltages only slightly above the threshold. Furthermore, the thin gate insulator gives them comparatively high transconductance, and the effective electron velocities achieved are also higher than those in room-temperature MESFETs, so that potential clock speeds are also higher. HEMT devices are excellent candidates for building high-performance, very large scale integrated circuits, especially for operation at low temperatures.

HEMTs which may have T-shaped gates have conventionally been fabricated using a self-aligned, refractory metal gate process as disclosed in an article entitled "High-temperature stable W/GaAs interface and application to metal-semiconductor field-effect transistors and digital circuits", by J. Josefowicz et al, in Journal of Vacuum Science Technology, B 5(6), pp. 1707–1715, (November/December 1987). Refractory metal gates refer to gate metals which are thermally stable at temperatures on the order of 800° C. These gate metals are highly resistive, and include tungsten silicide, tungsten nitride, and tungsten silicidenitride. In such a process, a refractory metal gate is formed with a nickel top, and a silicon implant is performed to create the source and drain regions on either side of the gate. The nickel is then stripped off, and the wafer is annealed at a temperature of approximately 800° C. to activate the implant, creating N+ source and drain regions.

The refractory metal gate process suffers from serious drawbacks in that the gate is highly resistive, and the high temperature processing required to activate the implants is destructive to material systems which are desirable to employ in HEMT fabrication.

In order to control the intrinsic current characteristics of the device, the gate in a HEMT may be recessed into the channel region to a desired degree as disclosed in an article entitled "Narrow Recess HEMT Technology", by C. Wu et al, in Journal of Electrochemical Society, Vol. 134, no. 10, pp. 2613–2616 (October 1987). In such a process, the gate is realigned to the source and drain ohmic contacts. However, the realignment accuracy is limited by the proximity of the source metal. The metal reflects the incident electrons during the electron-beam lithography process, which distorts the resist profile severely. This limits the source-gate dimension to a minimum of 3000 angstroms. Similarly, the source-drain spacing within which the gate is placed has to be larger than 1 micron.

Another process which has been used in the fabrication of HEMTs involves the formation of a substitution or "dummy" gate, which is temporarily used for fabrication of the gate and source ohmic contacts prior to formation of the operative metallic gate. An example of a process using a substitution gate is disclosed in an article entitled "High-Speed GaAs Frequency Dividers Using a Self-Aligned Dual-Level Double Lift-Off Substitution Gate MESFET Process", by M. Chang et al, in IEEE Electron Device Letters, vol. EDL-6, no. 6, pp. 279–281 (June 1985). An exemplary dummy gate process is disclosed in an article entitled "5.9 ps/gate operation with 0.1 micron gate-length GaAs MESFETs", by Y. Yamane et al, IEDM Proceedings 1988, pp. 894–896. These processes require the formation of the substitution or dummy gates followed by the formation of the operative gates, involving numerous and intricate fabrication steps.

SUMMARY OF THE INVENTION

The present invention provides a self-aligned gate technology for high performance GaAs and InP based HEMTs and related microelectronic devices. The invention enables the fabrication of a self-aligned, T-gate HEMT having low parasitic resistance, and without the utilization of any high temperature (above approximately 300° C.) process steps. The present process also provides a passivated T-gate HEMT with greatly reduced gate resistance over conventional HEMTs fabricated using refractory gate metal materials.

A device fabricated in accordance with the present invention has extremely high frequency response, and is suited for microwave and digital applications such as high speed frequency dividers. It provides a source-drain spacing of less than 0.4 microns, coupled with a short gate length on the order of 0.15 microns to achieve high drain current, an $f_t$ of at least 200 GHz, and a low knee voltage of approximately 0.3 V. This, in turn, produces a device with a low millimeter-wave noise figure, high gain, and fast switching speed with low power dissipation due to reduced voltage swing.

The present self-aligned gate (SAG) process allows the source-gate and gate-drain separation to be on the order of 1000 angstroms, which is the size of the lateral extensions of the top portion of the T-gate on either side of the gate footprint. Since the gate is used to define the source and drain metallizations, the gate metal is thickened by an amount equal to the ohmic metal thickness. This reduces the gate resistance by a substantial amount, on the order of 25–50%.

In accordance with the present invention, a generally T-shaped gate is formed by electron beam irradiation of a multilevel resist structure on a substrate. The resist structure has an upper layer which is more sensitive to the electron beam than a lower layer thereof. A generally T-shaped opening is formed in the resist structure by dissolution of the irradiated areas. An electrically conductive metal is deposited to fill the opening and thereby form a T-shaped gate on the substrate. After the resist layer structure and metal deposited thereon is removed, a masking layer is formed on the substrate around the gate, having an opening therethrough which is aligned with and wider than the cross section of the gate, and defining first and second lateral spacings between opposite extremities of the cross section and adjacent edges of the opening. Deposition of an electrically conductive metal forms source and drain metallizations on the substrate on areas underlying the first and second lateral spacings respectively. The metallizations are self-aligned to the gate and separated therefrom by the masking effect of the gate during the metal deposition. The gate may have an asymmetrical top section which provides a larger spacing between the gate and drain metallization than between the gate and source metallization to increase the breakdown voltage of the device. Insulative oxide sidewalls may be formed on the gate.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
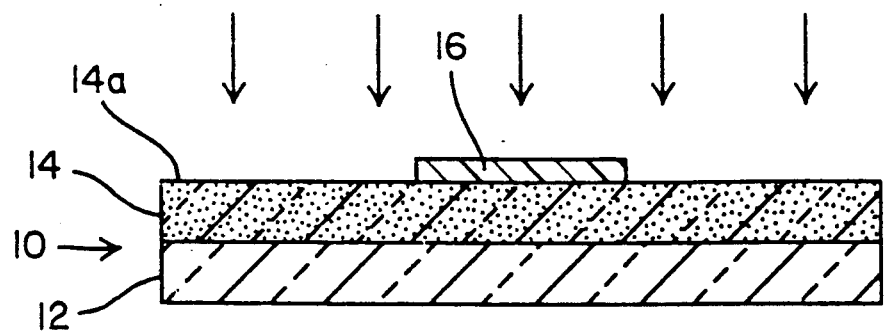
FIGS. 1 to 18 are simplified cross sectional views illustrating a self-aligned process for fabricating a T-gate HEMT or other applicable type of transistor device embodying the present invention.

Referring now to FIG. 1 of the drawing, the first step in the fabrication process of the present invention includes providing a substrate 10. Although the invention is especially suited to the fabrication of HEMTs using GaAs or InP material systems in which a doped donor layer is formed over an undoped channel layer on a semi-insulating wafer, the invention is not so limited. The invention may be used, for example, for the fabrication of other transistor structures such as MESFETs, in which the substrate 10 may include a single wafer of a semiconductive material such as Si, Ge, GaAs, or the like. However, in a preferred embodiment of the invention for fabricating a HEMT using an InP material system, the substrate 10 includes an InP substrate or base layer 12 which is at least semi-insulating, and a semiconductive epitaxial layer structure 14 formed on the substrate layer 12, including a doped donor layer over an undoped channel layer which will be described below.

In FIG. 1, a photoresist mask 16 is formed by photolithography or the like on an area of a surface 14a of the epitaxial layer 14 on which the active elements of a transistor are to be formed in accordance with the present invention. Although only one mask 16 is shown in the drawing for simplicity of illustration, in practical device fabrication, a wafer will be divided into a number of unit cells, each of which includes a number of transistor devices in addition to at least one alignment mark and "etch FET". The alignment marks are provided to facilitate registration of the component layers of the devices during the fabrication process, and the etch FETs are provided to control recess etching in an optional subsequent process step as will be described below.

Figure 2:
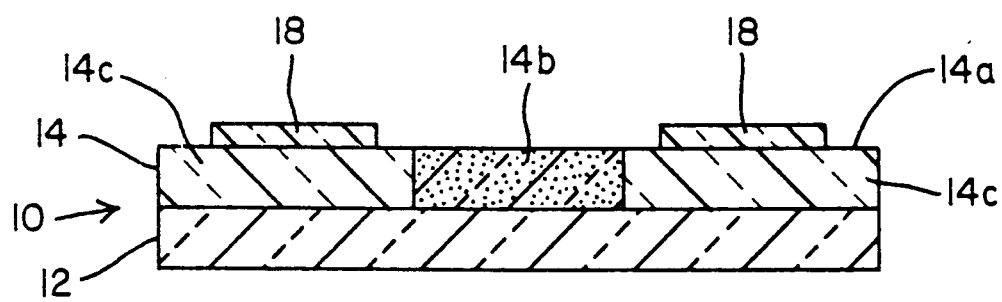

After the pattern of the mask 16 is defined, the surface 14a is subjected to implantation of ions which render the layer 14 electrically insulative in areas which are not covered by the mask 16. The purpose of this step is to electrically isolate the transistor devices on the substrate 10. Preferred ion species for effecting the desired isolation include oxygen and boron. After implantation, the epitaxial layer 14 includes an inner area 14b which was covered by the mask 16 and shielded thereby from the ion irradiation, and outer areas 14c which were rendered electrically insulative by the ion implantation, as illustrated in FIG. 2. The active electronic elements of the HEMT or other transistor device is fabricated on the area 14b in accordance with the present invention. It is further within the scope of the invention to electrically isolate the devices by etching away the epitaxial layer 14 down to either a non-conducting layer or semi-insulating substrate 10, abounding the active area.

As further illustrated in FIG. 2, the mask 16 is removed, and a dielectric layer 18 formed of, for example, SiO, is deposited over desired portions of the surface 14a laterally external of the active area 14b. The dielectric layer 18 is optional, and may be used in material systems using gate and overlay metals which do not satisfactorily adhere to the isolated regions 14c. The material of the layer 18 is selected to be strongly adherent to the epitaxial layer 14 and 14c, and also to the metal systems used in the process, as will be described in detail below.

The process steps illustrated in FIGS. 3 to 8 illustrate the formation of a generally T-shaped, electrically conductive gate using electron beam lithography. Although this method is preferred due to the extremely high resolution which is possible, the invention may be practiced using an alternative process such as optical lithography where the device requirements include higher power, and in which larger dimensions and spacings are indicated.

Figure 3:
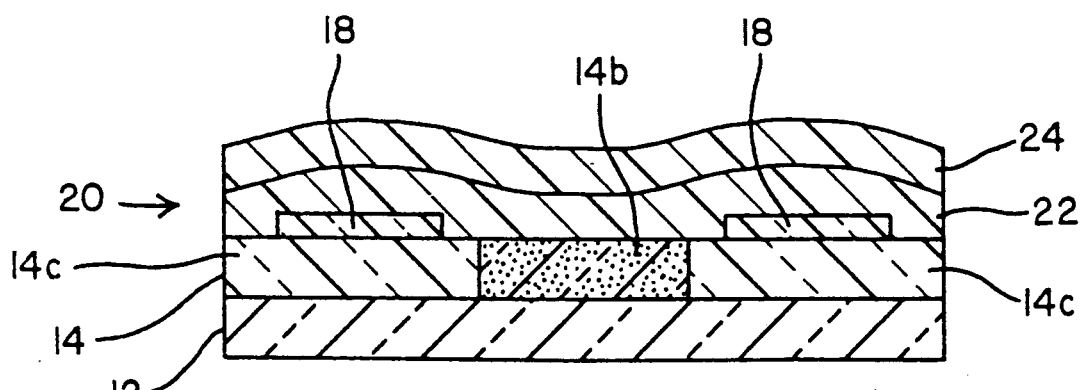

In the step of FIG. 3, a masking layer in the form of a resist layer structure 20 including a first resist layer 22 and a second resist layer 24 is formed over the surface 14a and dielectric layer 18 (if present). The resist layer 22 includes a material such as polymethyl methacrylate (PMMA), and the resist layer 24 includes a material such as a mixture of PMMA and methyl methacrylate (MMA) which is more sensitive to electron beam irradiation than pure PMMA.

Figure 4:
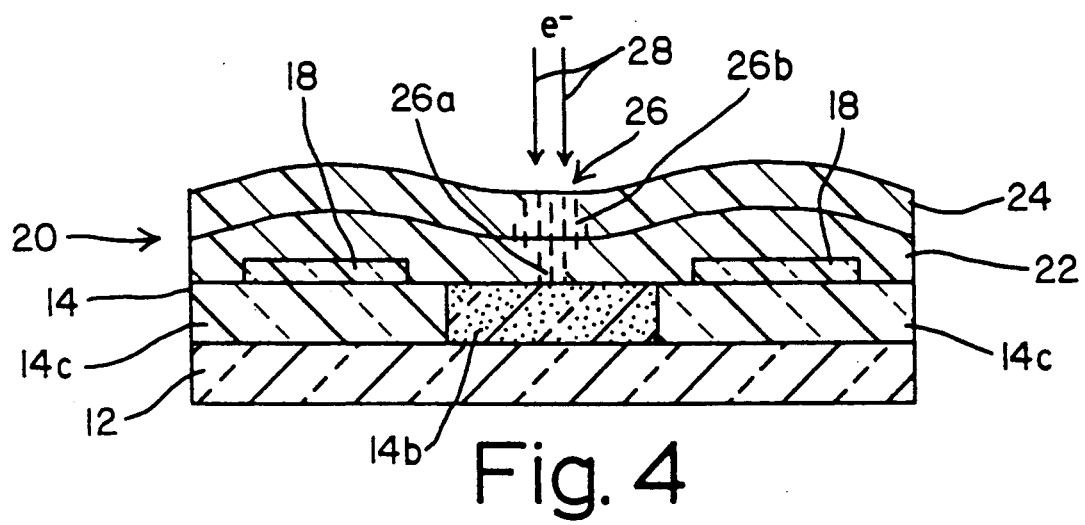

In the step of FIG. 4, electron beam lithographic apparatus such as a Phillips Beamwriter is used to irradiate a selected area 26 of the resist layer structure 20 with an electron beam as indicated by arrows 28. The electron beam writing is preferably performed in two or more parallel passes extending perpendicular to the plane of the drawing, although the invention can be practiced using one pass. The area 26 which is affected by the electron beam irradiation includes a lower area 26a in the layer 22 which is relatively narrow, and an upper area 26b in the layer 24 which is wider than the area 26a.

Figure 5:
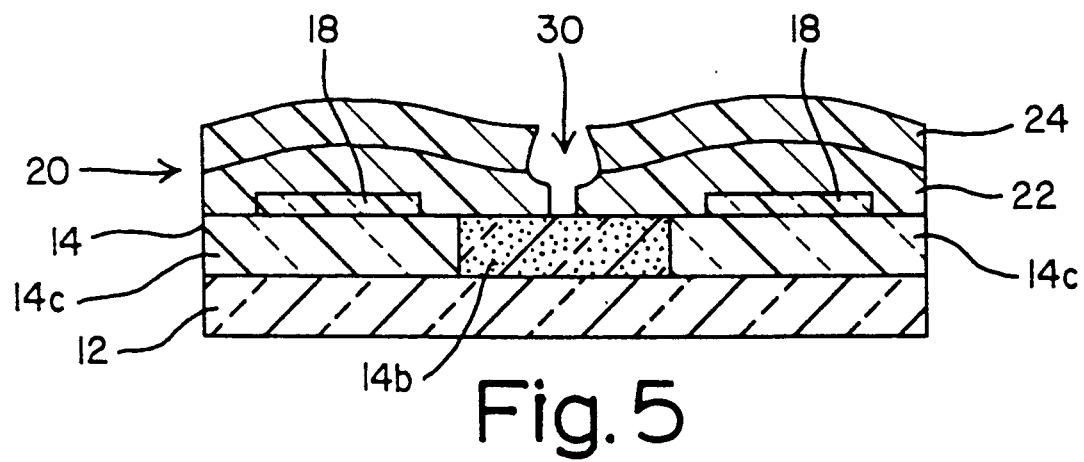
Figure 6:
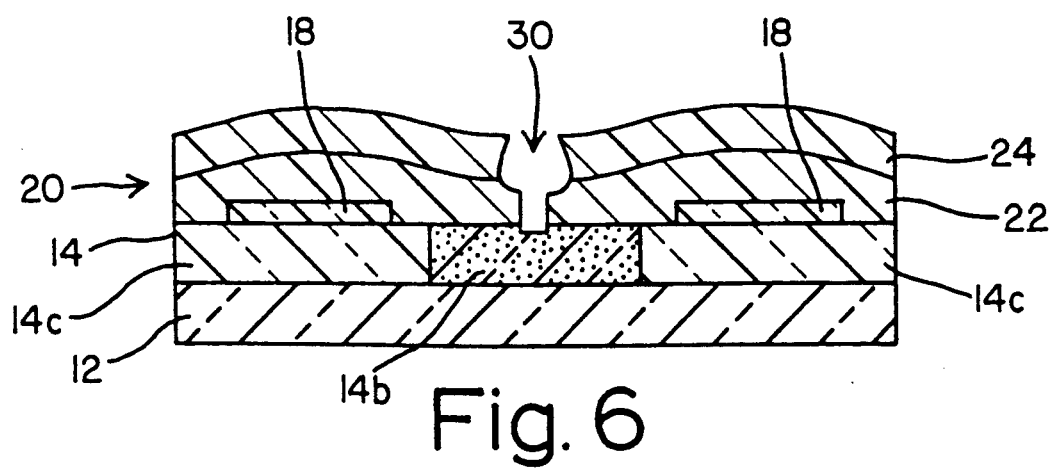

As shown in FIG. 5, an etchant or solvent is applied to develop the latent image formed by the electron beam by etching or dissolving away the area 26 which was irradiated by the beam. As shown, the etching or development step produces a generally T-shaped gate opening 30 having a negative re-entrant angle. If desired, the opening 30 may be subjected to an optional second etching step as illustrated in FIG. 6, to recess or extend the bottom of the opening 30 into the epitaxial layer 14 to a desired depth. During the recess etching step, the etch FETs (not shown) which were formed as discussed above are used to monitor current flow through the epitaxial layer 14, and thereby precisely control the etching depth to a selected level.

Figure 7:
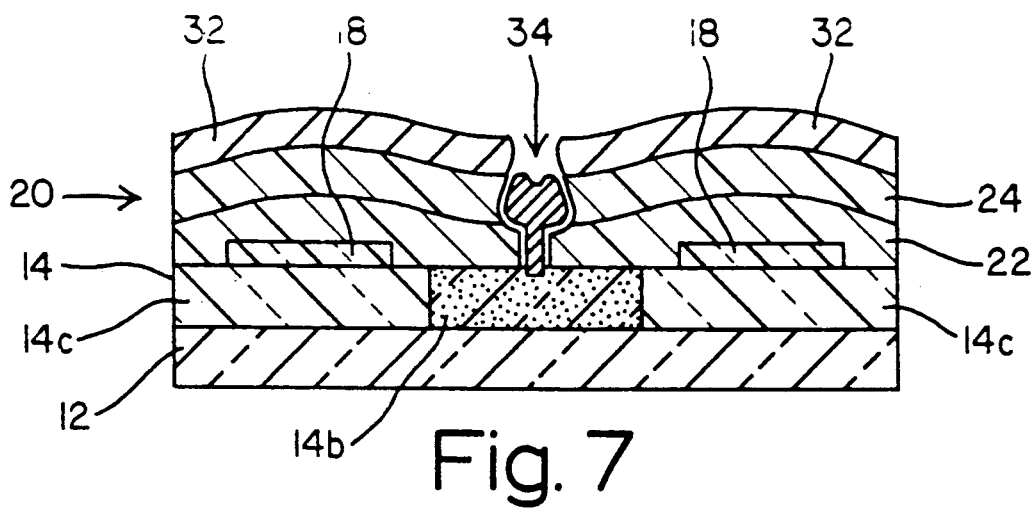
Figure 8:
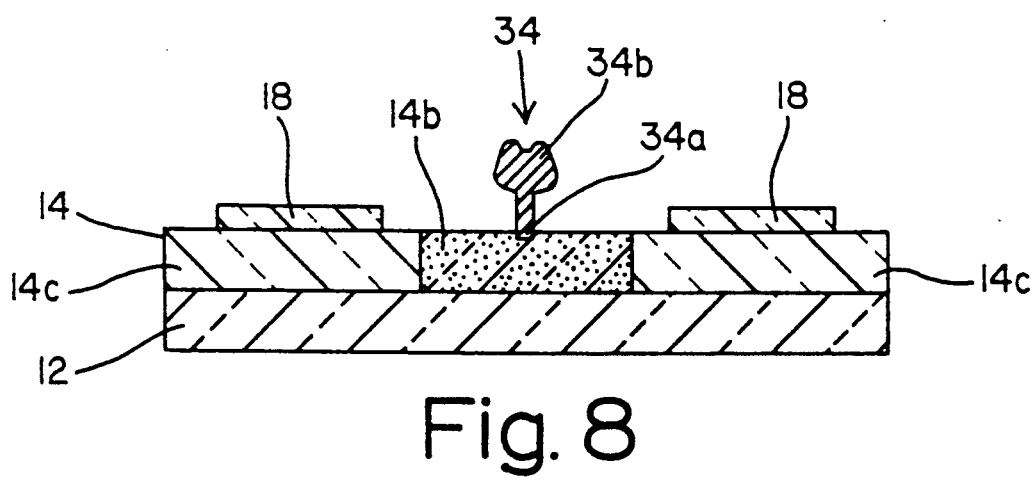

In the next step of FIG. 7, an electrically conductive material is deposited over the surface 14a, preferably in the form of a multi-layer metal structure including layers of titanium, platinum, and gold. The metal is deposited over the surface of the resist layer structure 20 as indicated at 32, and also inside the opening 30 to form a T-gate 34. The resist layer structure 20 and overlying metal are then removed by lifting off to produce the structure illustrated in FIG. 8.

The T-gate 34 generally conforms to the shape of the opening 30, and has a cross section including a narrow base or bottom 34a which defines a "footprint", and a wider top 34b which functions as a mask for self-alignment of source and drain metallizations as will be described below. The aspect ratio, or the ratio of the width of the top 34b to the width of the bottom 34a, is preferably on the order of 4:1. Fabrication of a practical device using electron beam lithography enables the width of the bottom 34a to be approximately 0.1 micron, and the width of the top to be approximately 0.4 micron. The T-gate 34 is preferably formed in an elongated configuration, with a length extending perpendicular to the plane of the drawing on the order of 50 microns, and a height of approximately 3750 angstroms.

Figure 9:
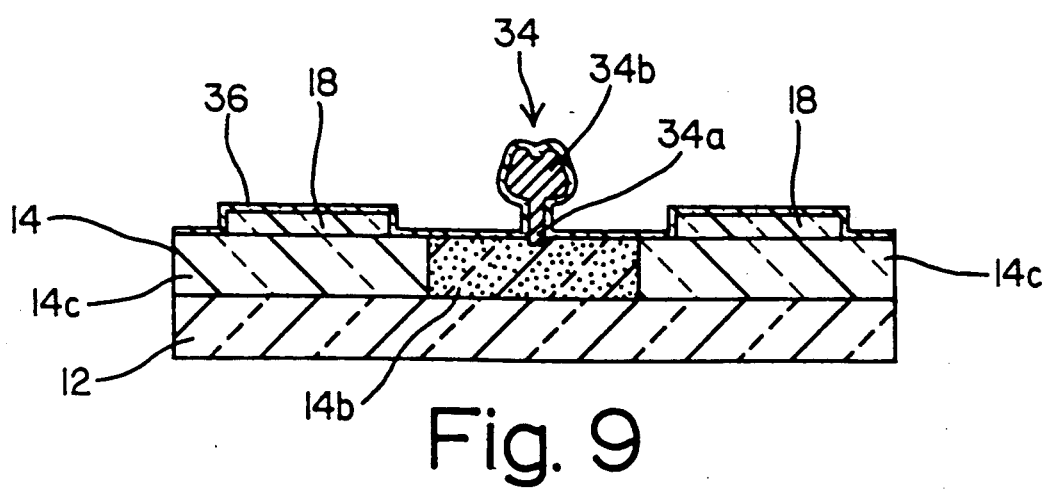
Figure 10:
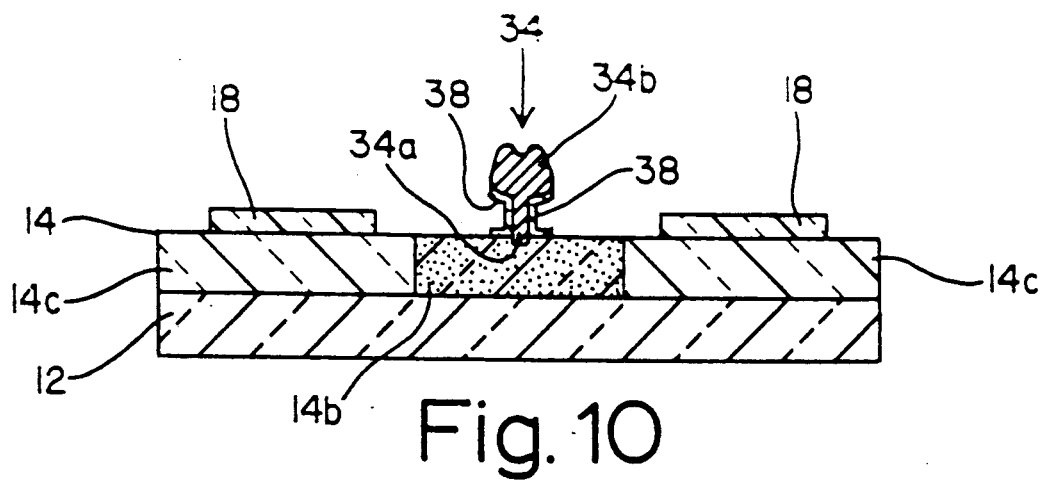

FIGS. 9 and 10 illustrate optional steps for forming a dielectric sidewall on the T-gate 34. Such a sidewall is generally unnecessary using an InP material system. However, where a GaAs material system is utilized, material may diffuse from source and drain ohmic metallizations formed in a subsequent processing step into the spacings between the metallizations and the T-gate 34 to undesirably reduce the resistance therebetween. The dielectric sidewall acts as a barrier to prevent this effect.

As shown in FIG. 9, a layer 36 of a dielectric material such as $SiO_2$ or $Si_3N_4$ is deposited over the surface 14a and T-gate 34. In FIG. 10, a vertical etching process such as reactive ion etching (RIE) is performed to remove the layer 36 in all areas which are not masked vertically. In the present configuration, the top 34b of the T-gate 34 functions as a self-aligned mask which prevents etching of the layer 36 from the sidewalls of the T-gate 34 and surface 14a underlying the top 34b. The result of the etching step is the formation of the desired dielectric sidewalls which are designated as 38 in FIG. 10.

Figure 11:
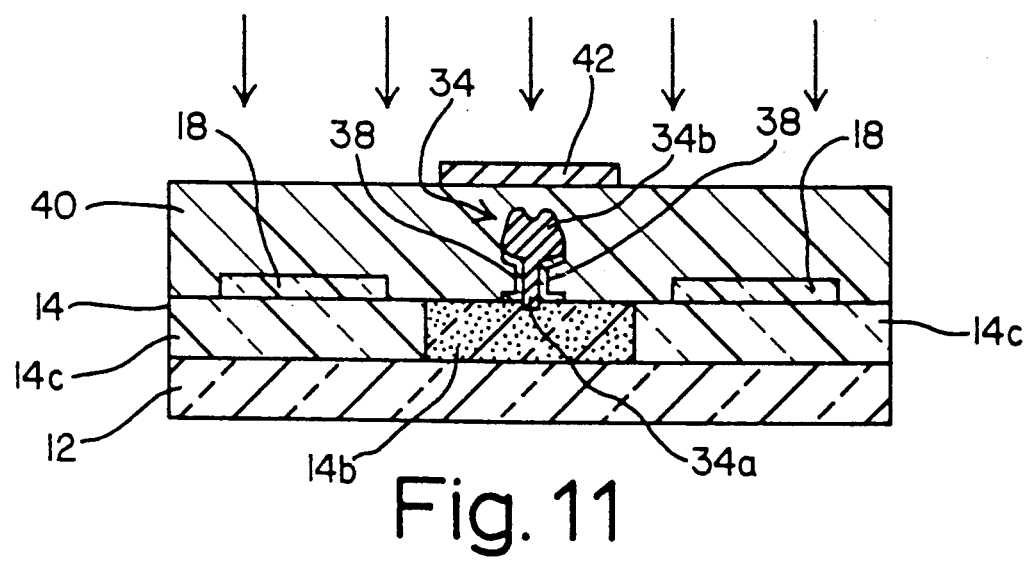
Figure 12:
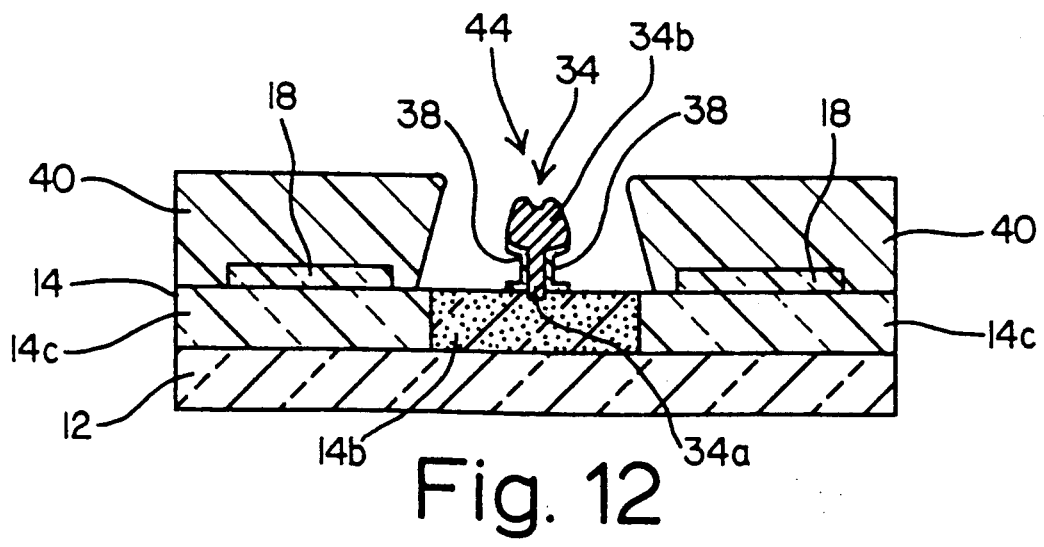

Referring now to FIG. 11, a masking or photoresist layer 40 is deposited over the surface 14a and T-gate 34. A quartz mask plate 42, for example, patterned with chrome, is placed in contact atop the layer 40 in alignment with the T-gate 34. Irradiation with ultraviolet light is then performed as indicated by arrows to expose the photoresist layer 40 laterally external of the central area which is covered with the mask 42. The mask 42 is then removed, and the structure subjected to an image reversal process which results in the exposed area being hardened and the covered area being softened with respect to a selected etchant. The etchant is then applied to etch away the unhardened area which was covered by the mask 42, to form an opening 44.

Figure 13:
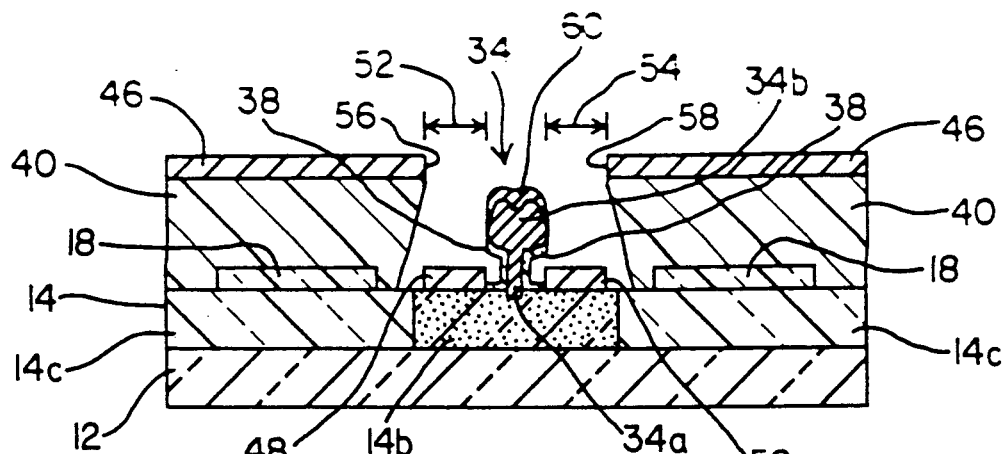

As illustrated in FIG. 13, an electrically conductive material 46, preferably including layers of alloyed gold and germanium, nickel, and gold respectively, is deposited over the photoresist layer 40 and unmasked areas of the surface 14a. The material 46 deposited on the surface 14a forms a source ohmic contact or metallization 48 and a drain ohmic contact or metallization 50. In accordance with the self-aligning feature of the present invention, the width of the mask 42 is selected such that a first lateral spacing 52 is defined between the leftward lateral extremity of the cross section of the T-gate 34 and an adjacent edge 56 of the opening 44 as viewed in the drawing, and a second lateral spacing 54 is defined between the opposite or right lateral extremity of the cross section and an adjacent edge 58 of the opening 44. The metallizations 48 and 50 are deposited on the surface 14a in areas which vertically underlie the spacings 52 and 54 respectively.

Figure 14:
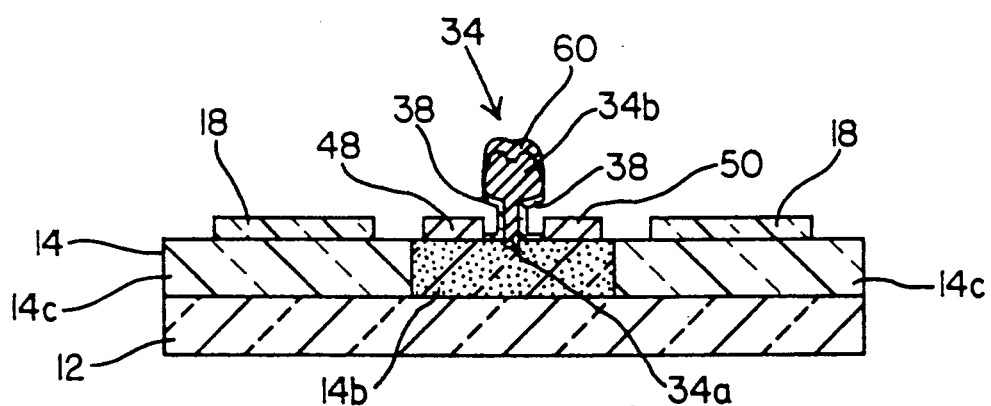

The top 34b of the T-gate 34 acts as a mask in the same manner as in the dielectric sidewall formation step of FIG. 10, preventing deposition of metal on the surface 14a in areas which vertically underlie the top 34b. The width of the T-gate 34 thereby defines the channel width of the HEMT or other transistor device, and may be very short. The metallizations 48 and 50 are separated from the bottom 34a of the T-gate 34 by spacings equal to the lateral extensions of the top 34b over the bottom 34a of the T-gate 34. The small source-gate and gate-drain spacings, in combination with the small channel length, achieve a transistor which is capable of operation at extremely high frequencies. FIG. 14 illustrates the appearance of the structure after removing or lifting off the photoresist layer 40 and overlying metal material 46.

The wide top 34b of the T-gate 34 has the further desirable effect of reducing the gate resistance of the device by providing an increased cross sectional area for current flow. In addition, a cap 60 of the conductive material 46 is deposited on the T-gate 34 in the step of FIG. 13 simultaneously with the formation of the metallizations 48 and 50. The cap 60 further reduces the gate resistance of the device by approximately 25-50%.

FIG. 15 to 18 illustrate the fabrication of overlay metallizations, which serve to connect the source and drain metallizations 48 and 50 to external circuitry. Where the material of the overlay metallizations does not adhere to the material of the epitaxial layer 14, the dielectric layer 18 which was formed in the manner described above is provided on areas of the surface 14a on which the overlay metallizations are to be formed.

Figure 15:
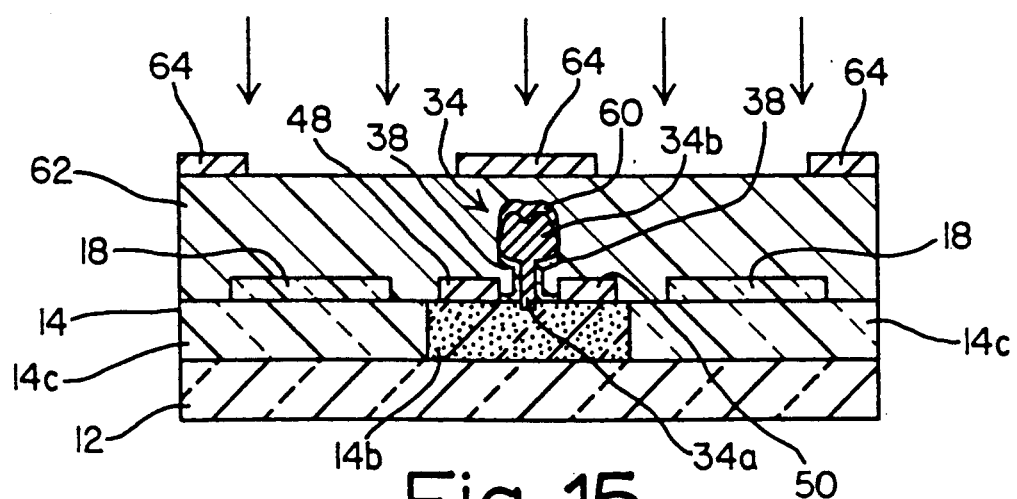
Figure 16:
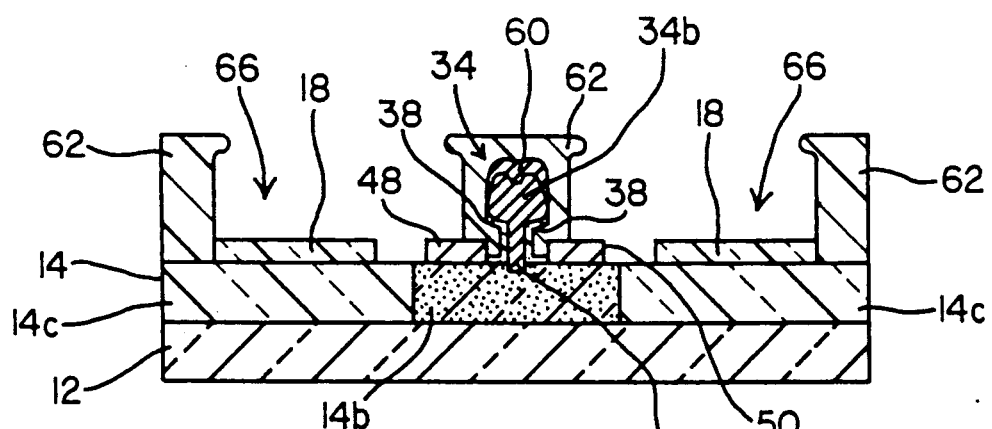
Figure 17:
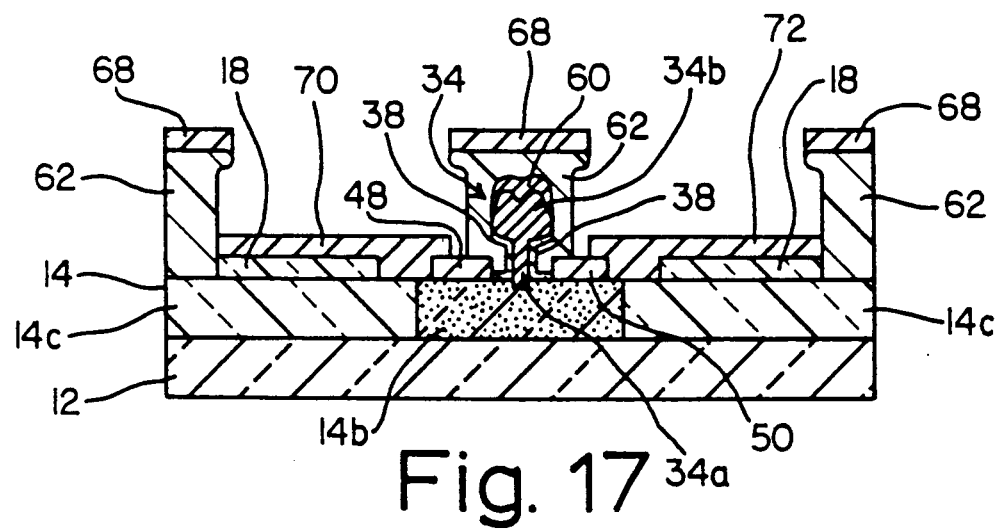

As illustrated in FIG. 15, a masking or photoresist layer 62 is deposited over the structure, and a mask 64 made of, for example, quartz with a chrome pattern, is placed on the photoresist layer 62. The layer 62 is irradiated with ultraviolet light as indicated by arrows to soften the areas which are not covered by the mask 64. An etchant is applied to dissolve away the uncovered areas of the layer 62 to produce the structure illustrated in FIG. 16. This step produces openings 66 which overly the dielectric layer 18, laterally outer portions of the metallizations 48 and 50, and spaces therebetween. In the step of FIG. 17, a layer 68 of electrically conductive material which preferably includes layers of titanium, platinum, and gold, is deposited over the structure. The material 68 deposited on the uncovered areas at the bottoms of the openings 66 forms source and drain overlays 70 and 72 in ohmic contact with the source and drain metallizations 48 and 50 respectively.

Figure 18:
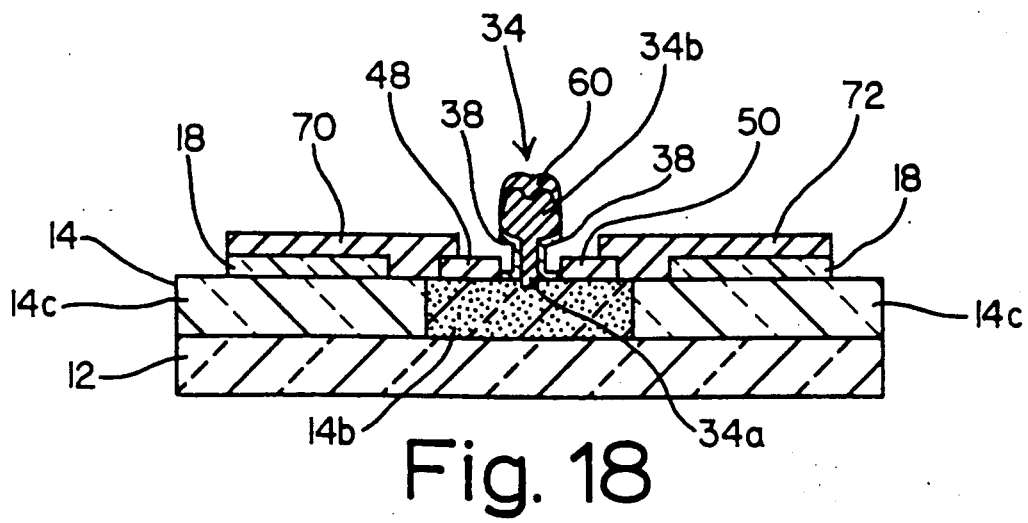

In the final step of FIG. 18, the photoresist layer 62 and overlying metal material 68 are removed to produce the structure as illustrated.

Figure 19:
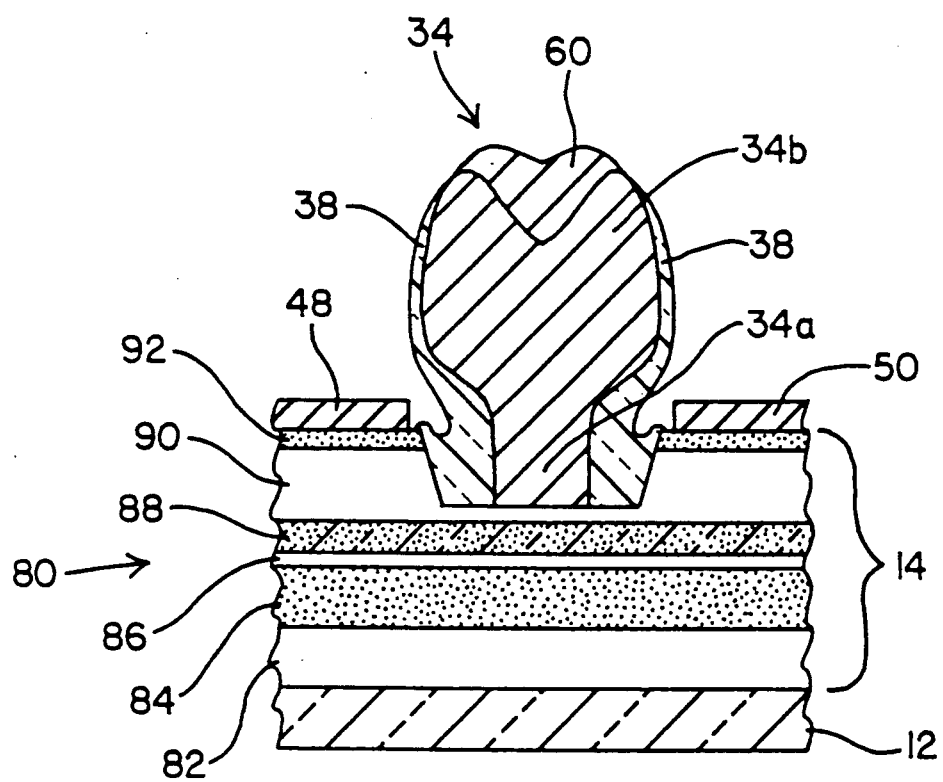
FIG. 19 is an enlarged cross sectional view illustrating a T-gate fabricated in accordance with the present invention.

A self-aligned T-gate HEMT fabricated by the process of the present invention is illustrated in enlarged cross section in FIG. 19, and generally designated as 80, with like elements being designated by the same reference numerals used in FIGS. 1 to 18. The epitaxial layer structure 14 includes an AlInAs buffer layer 82, and an undoped GaInAs channel layer 84 approximately 400-500 angstroms thick formed on the buffer layer 82. An undoped spacer layer 86 of AlInAs approximately 15 angstroms thick is formed on the layer 84. A negatively doped donor layer 88 of AlInAs approximately 35 angstroms thick is formed on the layer 86. An undoped layer 90 of AlInAs approximately 150-300 angstroms thick is formed on the layer 88 to reduce the gate leakage current. A GaInAs cap layer 92 approximately 20 angstroms thick is formed on the layer 90. The Au:Ge/Ni/Au metallizations 48 and 50 as well as the cap 60 are approximately 1000 angstroms thick.

Figure 20:
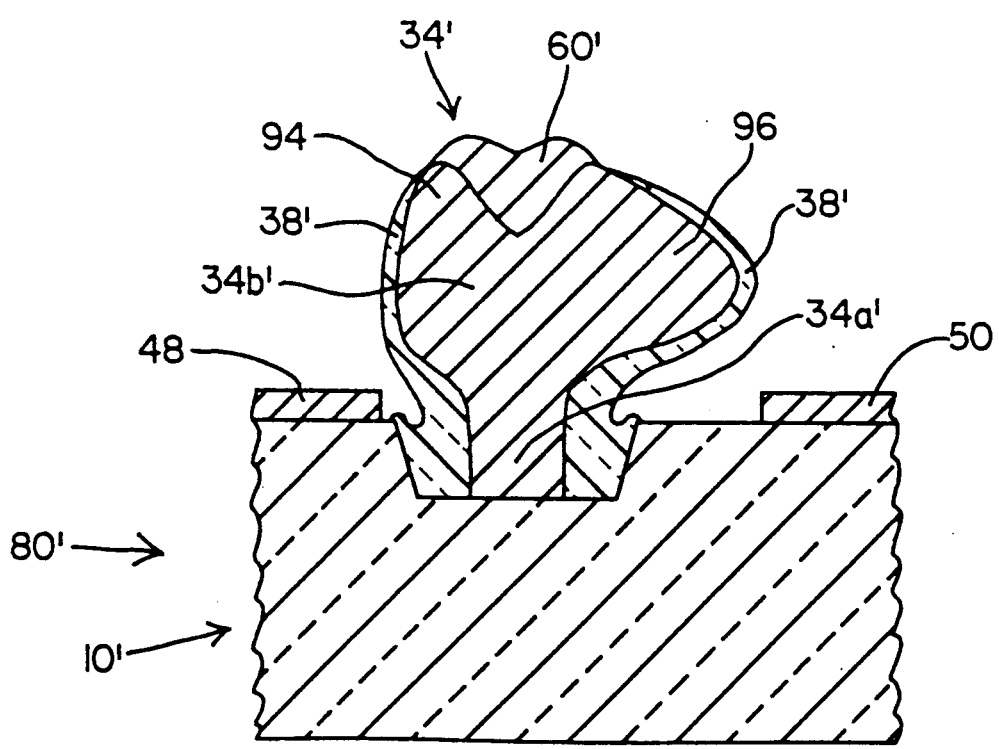
FIG. 20 is similar to FIG. 19, but illustrates a modified, asymmetrical T-gate embodying the invention.

FIG. 20 illustrates a modified HEMT 80' fabricated in accordance with the present process, in which modified elements are designated by the same reference numerals primed. The top 34b' of the T-gate 34' is made asymmetrical in order to increase the breakdown voltage of the device. More specifically, the top 34b' has a first portion 94 which extends from the bottom 34a toward the source metallization 48 by a first distance, and a second portion 96 which extends from the bottom 34a toward the drain metallization 50 by a second distance which is larger than the first distance. The larger lateral extension of the second portion 96 results in a spacing between the T-gate 34' and drain metallization 50 which is larger than the spacing between the T-gate 34' and source metallization 48, which increases the breakdown voltage of the HEMT 80'.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

We claim:

1. A process for fabricating a T-gate HEMT, comprising sequential the steps of:
    (a) providing a semiconductive layer structure having a doped donor layer formed over an undoped channel layer;
    (b) forming an electrically conductive T-gate on a surface of said layer structure, said T-gate including a base portion and a top portion which is wider than the base portion, the top portion including a first portion which extends laterally from the base portion in a first direction by a first distance, and a second portion which extends laterally from the base in the opposite direction by a second distance which is larger than the first distance;
    (c) forming a masking layer over the surface around the T-gate, the masking layer having an opening therethrough which is aligned with and wider than the T-gate such that first and second lateral spacings are defined between opposite extremities of the cross-section of the T-gate and adjacent edges of the opening respectively; and
    (d) depositing an electrically conductive material to form source and drain contacts on the surface underlying the first and second lateral spacings respectively.

2. A process as in claim 1, in which step (a) comprises providing the donor layer as including AlGaAs, and the channel layer as including GaAs.

3. A process as in claim 2, in which step (a) further comprises providing a substrate including GaAs on which the layer structure is formed.

4. A process as in claim 1, in which step (a) comprises providing the donor layer as including AlInAs, and the channel layer as including GaInAs.

5. A process as in claim 4, in which step (a) further comprises providing a substrate including InP on which the layer structure is formed.

6. A process as in claim 1, in which step (b) comprises the substeps of:
    (e) forming a gate masking layer over the surface;
    (f) forming a gate opening through the gate masking layer having a generally T-shaped cross section corresponding to said cross section of the T-gate;
    (g) depositing an electrically conductive gate material to substantially fill the gate opening; and
    (h) removing the gate masking layer and electrically conductive gate material deposited thereon from the substrate.

7. A process as in claim 6, in which:
step (e) comprises forming the gate masking layer as a resist layer structure; and
step (f) comprises the substeps of:
    (i) irradiating an area of the resist layer structure corresponding to the gate opening using an electron beam; and
    (j) applying an etchant to etch away the resist layer structure in said irradiated area..

8. A process as in claim 7, in which step (e) comprises forming the resist layer structure as including a first resist layer formed over the surface, and a second resist layer formed over the first resist layer, the second resist layer being more sensitive to the electron beam than the first resist layer.

9. A process as in claim 8, in which step (i) comprises irradiating the area of the resist layer structure using a plurality of parallel passes which extend perpendicular to said cross section of the gate opening.

10. A process as in claim 6, in which step (f) comprises forming the gate opening with a negative reentrant profile.

11. A process as in claim 1, in which step (c) comprises the substeps of:
    (e) forming the masking layer as a resist layer over the surface including an area corresponding to the opening;
    (f) applying a mask which covers the area of the resist layer corresponding to the opening;
    (g) irradiating the resist layer to cause hardening thereof external of the mask;
    (h) removing the mask; and
    (i) applying an etchant to etch away the resist layer in the unhardened area thereof which was covered by the mask in step (g).

12. A process as in claim 1, further comprising the step of:

(e) electrically isolating the device by rendering the layer structure surrounding the T-gate and source and drain contacts electrically insulative.

13. A process as in claim 12, in which step (e) comprises ion implantation.

14. A process as in claim 1, further comprising the step, performed after step (d), of:
(e) forming source and drain electrically conductive overlays over the surface in electrical connection with the source and drain contacts respectively.

* * * * *